United States Patent [19]
Maeda et al.

[11] Patent Number: 5,091,322
[45] Date of Patent: Feb. 25, 1992

[54] SEMICONDUCTOR DEVICE AND METHOD OF MANUFACTURING THE SAME

[75] Inventors: Takeo Maeda; Hiroshi Momose, both of Tokyo, Japan

[73] Assignee: Kabushiki Kaisha Toshiba, Kawasaki, Japan

[21] Appl. No.: 572,136

[22] Filed: Aug. 22, 1990

Related U.S. Application Data

[62] Division of Ser. No. 507,037, Apr. 10, 1990.

[30] Foreign Application Priority Data

Apr. 14, 1989 [JP] Japan .................................. 1-94884
Mar. 30, 1990 [JP] Japan .................................. 2-83909

[51] Int. Cl.$^5$ ..................... H01L 21/265; H01L 29/70
[52] U.S. Cl. ......................................... 437/31; 437/59; 148/DIG. 9
[58] Field of Search .............. 437/54, 59; 148/DIG. 9

[56] References Cited

U.S. PATENT DOCUMENTS

| | | | |
|---|---|---|---|
| 4,589,004 | 5/1986 | Yasuda . | |
| 4,637,125 | 1/1987 | Iwasaki et al. | 29/571 |
| 4,764,480 | 8/1988 | Vora | 437/54 |
| 4,774,204 | 9/1988 | Havemann . | |
| 4,799,098 | 1/1989 | Ikeda et al. . | |
| 4,806,499 | 2/1989 | Shinohara . | |
| 4,879,255 | 11/1989 | Deguchi et al. . | |
| 4,902,640 | 2/1990 | Sachitano et al. | 437/31 |
| 4,914,048 | 8/1990 | Scovell et al. . | |
| 4,922,318 | 5/1990 | Thomas et al. . | |
| 4,957,874 | 9/1990 | Soejima | 437/31 |

FOREIGN PATENT DOCUMENTS

| | | |
|---|---|---|
| 61-17112 | of 0000 | Japan . |
| 60-76553 | of 0000 | Japan . |
| 62-122315 | of 0000 | Japan . |
| 62-207111 | of 0000 | Japan . |
| 62-213151 | of 0000 | Japan . |
| 62-240196 | of 0000 | Japan . |

*Primary Examiner*—Olik Chaudhuri
*Assistant Examiner*—Long Pham
*Attorney, Agent, or Firm*—Banner, Birch, McKie & Beckett

[57] ABSTRACT

A method of manufacturing a semiconductor device. A semiconductor substrate is prepared and a gate oxide film is formed on a surface of the semiconductor substrate. The gate oxide film is selectively removed to expose portions of the semiconductor substrate and a first polysilicon layer is formed on a resultant semiconductor structure. Impurities are implanted in the polysilicon layer and a resultant semiconductor structure is annealed to activate the impurities. The first polysilicon layer is patterned to form a base electrode of the bipolar transistor and a gate and/or drain electrode of the MOS transistor. An insulating layer is then formed on a resultant semiconductor structure. Portions of the semiconductor substrate are then selectively exposed and a second polysilicon layer is formed on a resultant semiconductor structure. The second polysilicon layer is then patterned to form an emitter electrode of the bipolar transistor.

15 Claims, 5 Drawing Sheets

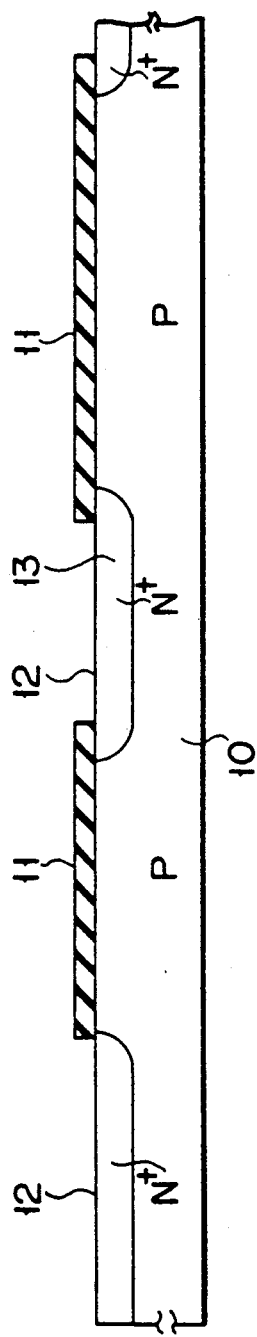
F I G. 1A
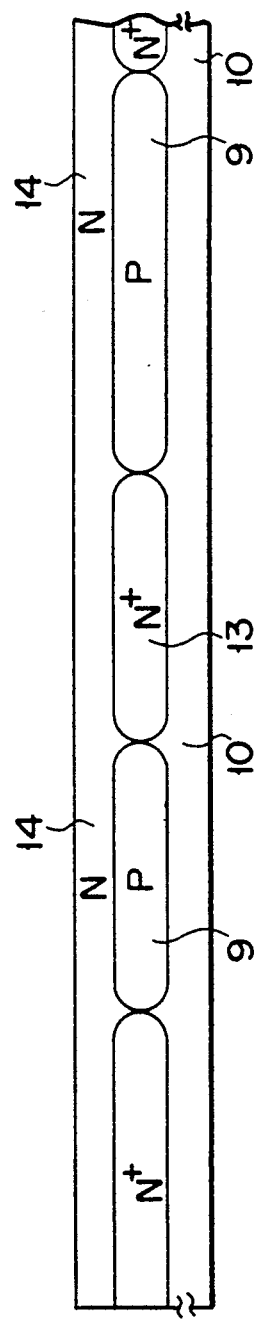
F I G. 1B
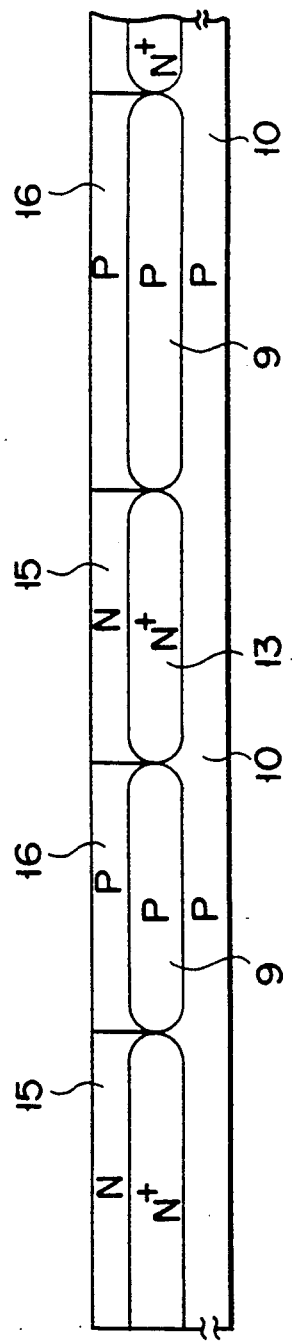
F I G. 1C

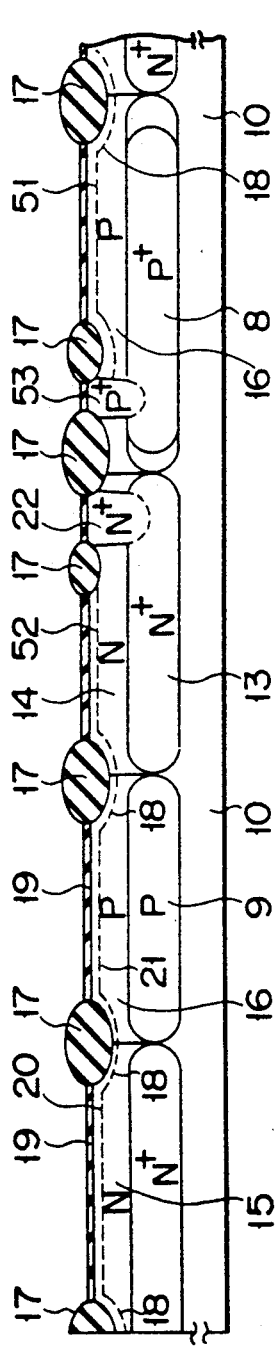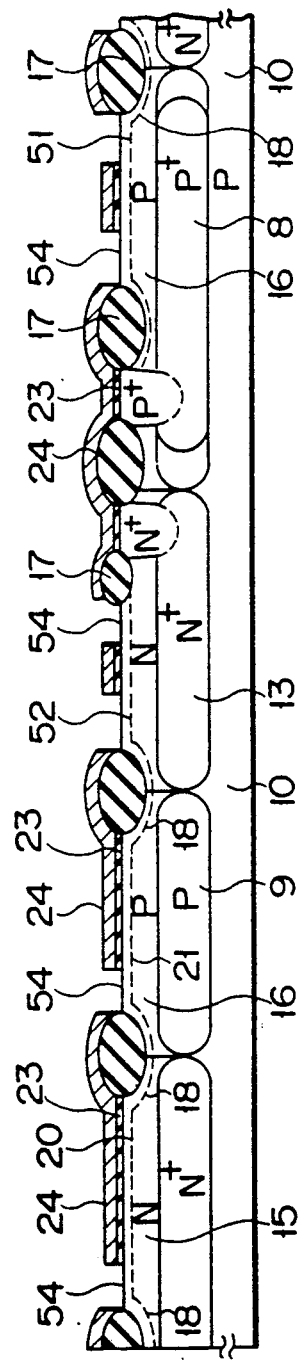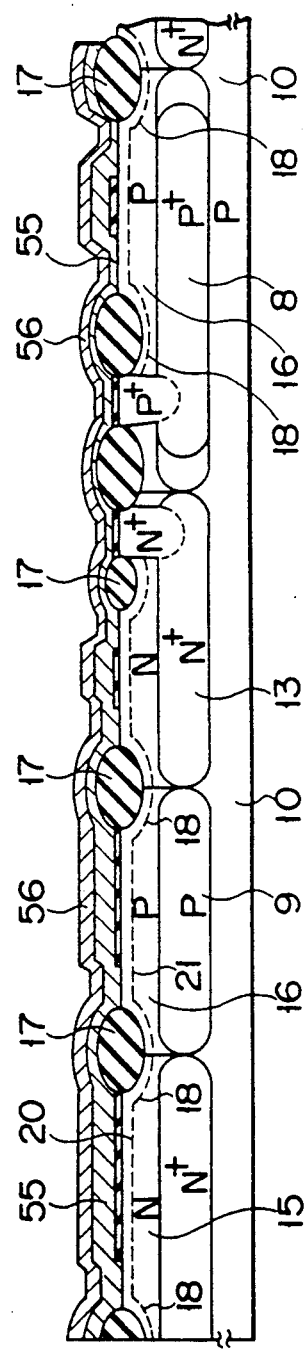
F I G. 1D  F I G. 1E  F I G. 1F

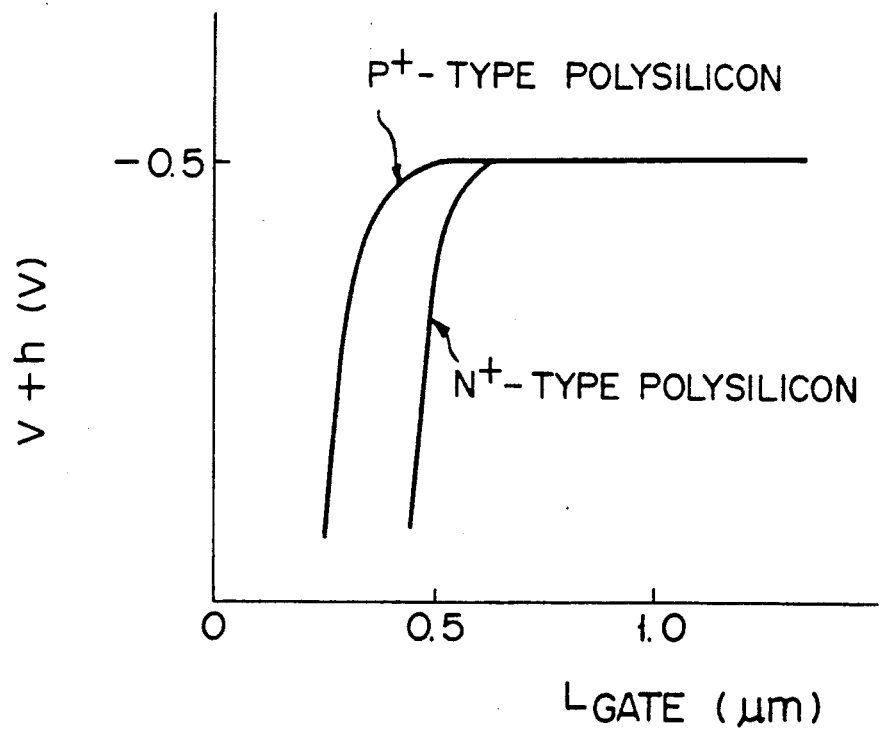
F I G. 3

SEMICONDUCTOR DEVICE AND METHOD OF MANUFACTURING THE SAME

This application is a continuation of application Ser. No. 07/507,037, filed Apr. 10, 1990.

BACKGROUND OF THE INVENTION

1. Field of the Invention

The present invention relates to a semiconductor device and a method of manufacturing the same and, more particularly, to a semiconductor device (to be referred to as a BiMOS hereinafter) on which a bipolar transistor and a MOS transistor are formed together, and a method of manufacturing the semiconductor device.

2. Description of the Related Art

A BiMOS technique is used for obtaining a high-speed LSI having low power consumption, in which a logic gate, formed by combining a high-speed bipolar transistor, and a highly integrated CMOS transistor, capable of reducing power consumption, are mounted on a single chip.

In the manufacture of a conventional BiMOS LSI, the gate material of NMOS and PMOS transistors is formed using n-type polysilicon, and an npn transistor is mainly used as the bipolar transistor. For this reason, the external base electrode of the npn bipolar transistor cannot be made of the same material as that of the gate electrode of the MOS transistor. Therefore, either the gate electrode or the external base electrode must be formed in advance.

In conventional BiMOS LSI the gate electrode is formed first. After forming the gate electrode, source and drain diffusion layers are formed by ion implantation and annealing. An external base electrode is formed, and then a base diffusion layer is formed by annealing.

However, when the gate electrode is formed in advance as described above, during the manufacture of elements, an annealing process must be performed twice for the MOS transistor. As a result, the sizes of the source and drain diffusion layers are excessively increased, and the channel width is decreased, thereby generating a short channel effect. Sufficient annealing cannot then be applied when the base diffusion layer of the bipolar transistor is formed. For this reason, the base resistance between the underlying portion of the external base electrode and an emitter diffusion layer increases, thus degrading the characteristics of the device.

SUMMARY OF THE INVENTION

It is an object of the present invention to provide a high-performance semiconductor device wherein electrodes of a MOS transistor and a base electrode of a bipolar transistor are made of the same kind of material, and an annealing process is performed once for the MOS transistor and twice for the bipolar transistor, thereby solving the problems of the short channel effect and the increase of the base resistance.

It is another object of the present invention to provide a method of manufacturing a high-performance semiconductor device wherein electrodes of a MOS transistor and a base electrode of a bipolar transistor are made of the same material, and an annealing process is performed once for the MOS transistor and twice for the bipolar transistor, thereby solving problems of the short channel effect and the increase of the base resistance.

In order to achieve the above objects, a semiconductor device of the present invention comprises:

a semiconductor substrate;

a bipolar transistor formed on the semiconductor substrate and having a base electrode; and a MOS transistor formed on the semiconductor substrate and having electrodes, the base electrode of the bipolar transistor and the electrodes of the MOS transistor containing the same impurity and forming a single layer.

In order to achieve another object of the present invention, a method of manufacturing a semiconductor device is provided. A semiconductor substrate is prepared and a gate oxide film is formed on a surface of the semiconductor substrate. The gate oxide film is selectively removed to expose portions of the semiconductor substrate and a first polysilicon layer is formed on a resultant semiconductor structure. Impurities are implanted in the polysilicon layer and a resultant semiconductor structure is annealed to activate the impurities. The first polysilicon layer is patterned to form a base electrode of the bipolar transistor and a gate and/or drain electrode of the MOS transistor. An insulating layer is then formed on a resultant semiconductor structure. Portions of the semiconductor substrate are then selectively exposed and a second polysilicon layer is formed on a resultant semiconductor structure. The second polysilicon layer is then patterned to form an emitter electrode of the bipolar transistor. The electrodes of the MOS transistor include gate and source drain extraction electrodes.

BRIEF DESCRIPTION OF THE DRAWINGS

The aspects and other features of the present invention will be described in the following detailed description with reference to the accompanying drawings, in which:

FIG. 3 is a graph showing comparison of gate lengths of a conventional semiconductor device and the semiconductor device of the present invention.

DETAILED DESCRIPTION OF THE PREFERRED EMBODIMENTS

Figure 1G:
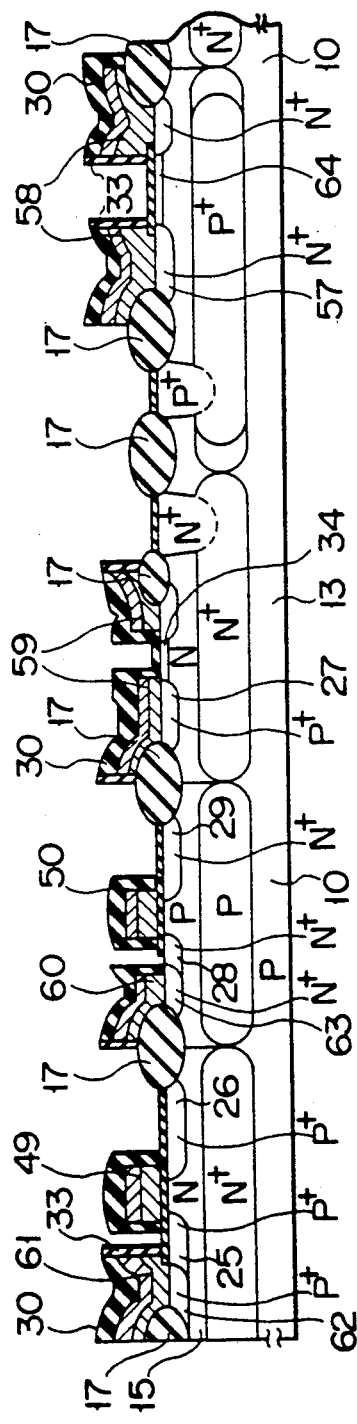
FIGS. 1A, 1B, 1C, 1E, and 1H are sectional views showing steps in manufacturing a semiconductor device of the present invention.

A method of manufacturing a semiconductor device used as a BiMOS element according to an embodiment of the present invention will be described below with reference to the accompanying drawings.

FIGS. 1A to 1H are sectional views showing steps in manufacturing a semiconductor device according to the present invention.

In the step shown in FIG. 1A, an insulating film 11 is deposited on a p-type Si semiconductor substrate 10 having a crystal plane (100). Portions in which a buried collector region and a PMOS element are to be formed are removed from the insulating film 11 by photoetching, thereby forming openings 12. In addition, n+-type buried collector layers (for increasing the depth of an n-well) 13 are formed in the substrate 10 by diffusing solid- or gas-phase antimony (Sb) from the opening 12 or by implanting arsenic (As) or Sb ions.

In the step shown in FIG. 1B, the insulating film 11 is entirely removed, and boron (B) ions are implanted in the entire surface of the substrate 10 at an acceleration energy of 100 keV and a dose of $6 \times 10^{12}$ cm$^2$. Thus, first low-concentration p-type buried regions 9 for avoiding a punch-through phenomenon are formed.

When an oxide film having a thickness of 50 Å or more is formed on the entire surface of the substrate 10 before forming the p-type buried regions 9, contamination upon ion implantation can be prevented. By annealing the resultant structure at a temperature of 850° C., damage to the substrate 10 is caused by the ion implantation can be eliminated, and the implanted impurity can be activated. In addition, although the impurity is implanted in the entire surface of the first p-type buried regions 9 in this embodiment, the impurity may be selectively implanted in the regions 9. In the step in FIG. 1D to be described later, an impurity can be implanted in a second high-concentration p$^{30}$-type buried region 8 and can be spaced apart by an interval of 2 μm or more from an n$^{30}$-type buried region 13, in consideration of diffusion of the impurity from the n$^+$-type region 13.

An n-type epitaxial layer 14 containing phosphorus (P) an impurity having a concentration of $1 \times 10^{16}$cm$^3$ is formed on the substrate 10 by epitaxial growth. At this time, the growth temperature is, e.g., 1,130° C., and the epitaxial layer 14 has a thickness of 1.2 μm.

In the step shown in FIG. 1C, a mask (not shown) for implanting ions is formed by photoetching. Using this mask, P ions are implanted in a PMOS forming region of the n-type epitaxial layer 14 and an npn bipolar element forming region at an acceleration energy of 160 keV and a dose of $5 \times 10^{12}$cm$^2$, to selectively form an n-type well region 15. Subsequently, using another mask, B ions are implanted in an NMOS element forming region and a pnp bipolar transistor element forming region, at an acceleration energy of 100 keV and a dose of $6 \times 10^{12}$/cm$^2$, to selectively form a p-type well region 16. The impurity concentrations of the n-type well region 15 and the p-type well region 16 are substantially equal to each other. Note that the p-type well region 16 may be formed before the n-type well region 15 is formed.

Furthermore, in the step in FIG. 1D, field oxide films 17 for isolating an MOS transistor from other MOS transistors and from a bipolar transistor are formed by selective oxidation. Each of the field oxide films 17 has a thickness of about 6,000 Å. Note that, before forming the field oxide film 17, an ion implantation region 18 for preventing inversion of the field is self-aligned. After the field oxide film 17 is formed, B ions are selectively implanted in the pnp transistor forming region 8 at an acceleration energy of 1 Mev and a dose of $1 \times 10^{15}$/cm$^2$. A dummy gate oxide film 19, having a thickness of about 150 Å, is formed on the entire surface of the resultant structure by thermal oxidation. Thereafter, channel ion implantation regions 20 and 21 for adjusting the threshold value of an NMOS transistor and a PMOS transistor and preventing a punch-through phenomenon, are formed in the surfaces of the n-type well region 15 and the p-type well region 16 respectively. The channel ion implantation region 20 on the n-well region 15 side is formed by implanting B ions at an acceleration energy of 20 keV and a dose of $3 \times 10^{12}$cm$^2$ and implanting P ions at an acceleration energy of 240 keV and a dose of $2 \times 10^{12}$/cm$^2$.

The channel region 21 on the p-well region 16 side is formed by implanting B ions at an acceleration energy of 20 keV and a dose of $4 \times 10^{12}$/cm$^2$.

At this time, BF2 ions are selectively implanted in an npn bipolar transistor forming region (shallow base) 52 at an acceleration energy of 20 keV and a dose of $1 \times 10^{13}$/cm$^2$, and As ions are selectively implanted in a pnp bipolar transistor forming region (shallow base) 51 at an acceleration energy of 30 keV and a dose of $1 \times 10^{13}$/cm$^2$, thereby decreasing resistance between internal and external base electrode portions. This ion implantation may be performed after forming a gate oxide film to be described later. In addition, P ions are implanted in the n-type epitaxial layer 14 at an acceleration energy of 320 keV and a dose of $1 \times 10^{16}$/cm$^2$, thereby forming a deep n$^+$-type ion implantation region 22 connected to the buried collector layer 13. B ions are implanted in a part of the pnp transistor forming region at an acceleration energy of 320 keV and a dose of $1 \times 10^{16}$cm$^2$, thereby forming a deep p$^+$-type region 53 for forming a collector electrode in the aforementioned part of the pnp transistor forming region. Note that the deep n$^+$-type and p$^+$-type regions may be formed before channel ion implantation.

In addition, in the step in FIG. 1E, after entirely removing the dummy gate oxide film 19, a gate oxide film 23 having a thickness of 50 to 120 Å is formed by oxidation. Note that the thickness of the gate oxide film 23 is desirably 120 Å or less. A first polysilicon layer 24, having a thickness of 50 to 500 Å, is deposited on the gate oxide film 23 by CVD (chemical vapor deposition). In this case, the deposition temperature is 610° C. or more. In addition, a contact portion 54 between the first polysilicon layer 24 and the Si substrate 10 is removed using a resist mask, and the gate oxide film 23 is also removed from a corresponding portion. The contact portions 54 serve as external base electrode contacts of the npn and pnp transistors and source drain extraction electrode contacts of the PMOS and NMOS transistors.

In the step shown in FIG. 1F, a second polysilicon layer 55 is deposited on the entire surface of the resultant structure to a thickness of 1,000 to 3,000 Å at a temperature of 600° C. or less. Note that a hydrogen gas may be used as a carrier gas instead of use a deposition at a temperature of 600° C. or less. First polysilicon layer 24 has been omitted from FIGS. 1F-1H in order to simplify the drawings. An n-type impurity is ion-implanted at a high concentration in a region for forming the pnp and NMOS transistors in the second polysilicon layer 55. For example, As ions are implanted at an acceleration energy of 40 keV and a dose of $5 \times 10^{15}$cm$^2$. In addition, a p-type impurity is implanted at a high concentration in a region for forming the npn and PMOS transistors in the second polysilicon layer 55. For example, BF2 ions are implanted at an acceleration energy of 40 keV and a dose of $5 \times 10^{15}$/cm$^2$.

Thereafter, annealing may be performed at a temperature of 900° C. for 10 minutes to activate the impurity implanted in the second polysilicon layer 55 and simultaneously diffuse it in the semiconductor substrate. In addition, a silicide 56 such as MoSi2 may be deposited on the entire surface of the resultant structure by sputtering, thereby forming a polycide structure. After sputtering the MoSi2, the impurity may be implanted.

In the step shown in FIG. 1G, an SiO2 film 30 having a thickness of 2,000 Å is deposited on the entire surface of the resultant structure by CVD. The SiO2 film 30 can be formed to leave it on only the npn and pnp transistor regions. Thereafter, the polycide structure is patterned to form external base electrode regions 58 and 59 of the pnp and npn transistors, gate electrode regions 49 and 50 of the PMOS and NMOS transistors, source drain electrode regions 61 and 60, and a wiring forming region. In this case, the minimum length of the gate electrode is 0.5 μm or less. Thereafter, the side wall of the patterned polysilicon layer and the surface of the Si substrate are oxidized in an oxygen atmosphere to form an oxide film 33. At this time, n+-type and p+-type regions for forming an outer electrode, i.e. external base regions 27 and 57 of the npn and pnp transistors and source regions 62 and 63 of the PMOS and NMOS transistors, are formed.

Furthermore, As ions are implanted in the NMOS transistor region at an acceleration energy of 60 keV and a dose of $5 \times 10^{15}/cm^2$ to form an n+-type source region 28 and an n+-type drain region 29 in self-alignment with the gate electrode, and $BF_2$ ions are implanted in the PMOS region at an acceleration energy of 60 keV and a dose of $5'10^{15}/cm^2$ to form p+-type source and drain regions 25 and 26 in self-alignment with the gate electrode. At the same time, As ions are implanted at an acceleration energy of 60 keV and a dose of $3 \times 10^{13}/cm^2$ to form an n--type internal base 64 of the pnp transistor, and B ions are implanted at an acceleration energy of 15 keV and a dose of $3 \times 10^{13}/cm^2$ to form a p--type internal base 34 of the npn transistor.

Figure 1H:
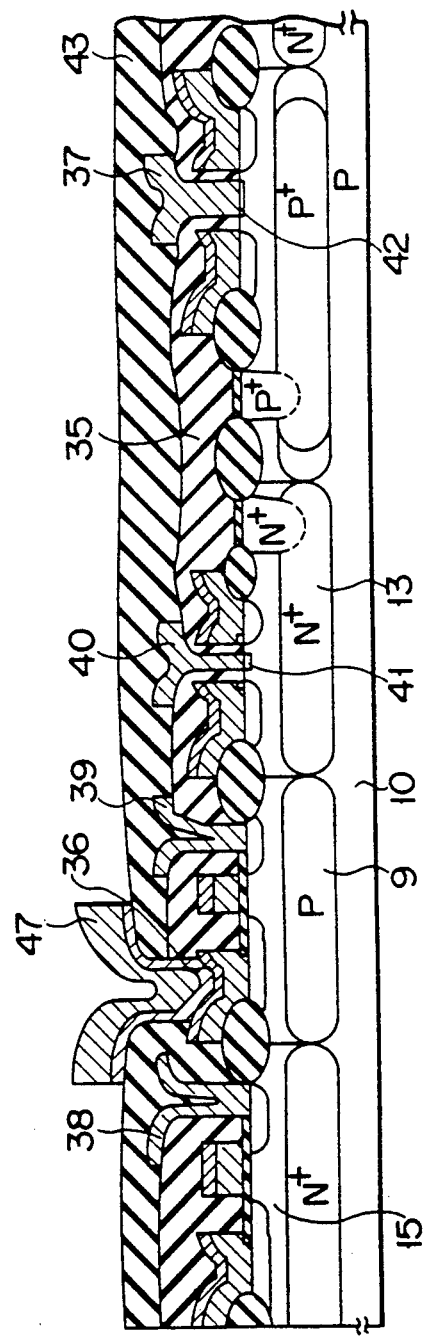

Thereafter, in the step in FIG. 1H, an $SiO_2$ film 35 having a thickness of 2,000 Å is deposited by CVD. Portions (emitter openings) in which the emitters of the npn and pnp transistors are to be formed are selectively etched from the $SiO_2$ film 35. Thus, the emitter openings 41 and 42 and the external base electrodes 59 and 58 can be formed in self-alignment.

Thereafter, a third polysilicon layer is deposited on the entire surface of the resultant structure to form an emitter electrode 37 of the pnp transistor, an emitter electrode 40 of the npn transistor, a source drain electrode 39 of the NMOS transistor, and a source drain electrode 38 of the PMOS transistor. In this case, this deposition is performed by LPCVD at a temperature of 600° C. or less or using $H_2$ as a carrier gas. The third polysilicon layer has a thickness of 1,000 to 4,000 Å.

B ions are implanted in the pnp transistor region and As ions are implanted in a region used as the npn transistor and a low-resistance wiring at an acceleration energy of 60 keV and a dose of $1 \times 10^{16}/cm^2$. A non-implanted region can be used for a high-resistance element or for a thin-film transistor (TFT) element. When any high-resistance element is not used, a silicide such as $MoSi_2$ or a metal can be deposited on the entire surface of the third polysilicon layer. Note that at least one element selected from Mo, W, Ti, Ta, and Co is used in the silicide or as the metal.

An insulating interlayer 43 made of $SiO_2$, BPSG or the like is formed by normal CvD, and the reflow process is performed at a temperature of 800 to 900° C. for 30 minutes to 1 hour. Then, a contact hole 36 is formed, and an Ag or AlCuSi alloy layer is deposited on a multilayered structure made of barrier metals such as Al, an AlCuSi alloy, Ti, or TiN and a wiring pattern 47 made of, e.g., aluminum is formed by patterning. After the reflow process, the resultant structure is annealed at a temperature of 1,000° C. to 1,100° C. for 5 to 60 seconds, and a desired bipolar transistor can be formed by increasing the impurity concentration in the emitter region.

Figure 2A:
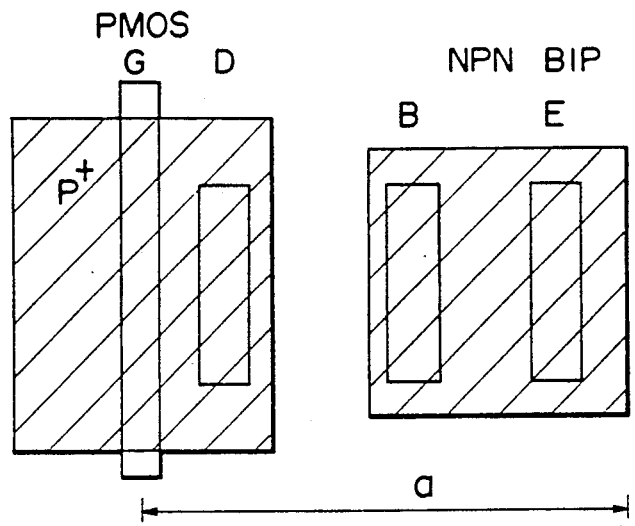
FIGS. 2A, 2B, and 2C are views for explaining an effect of the semiconductor device of the present invention.
Figure 2B:
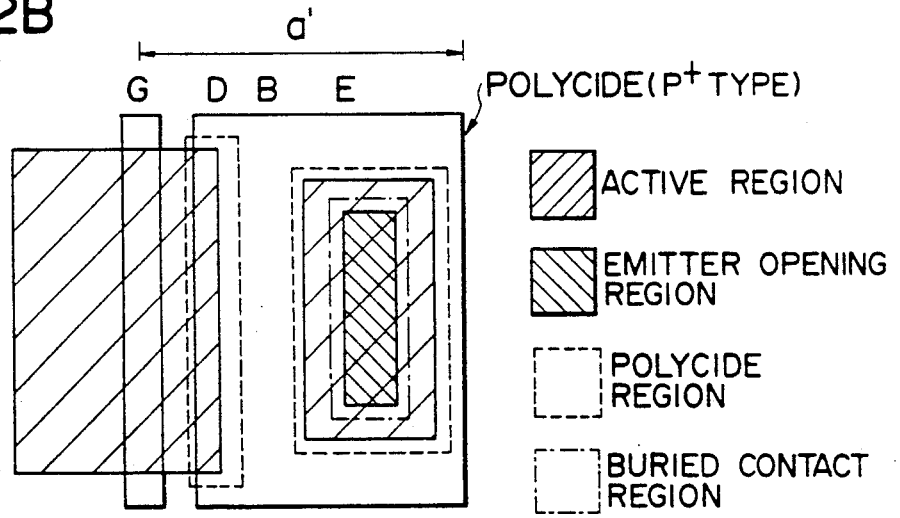
Figure 2C:
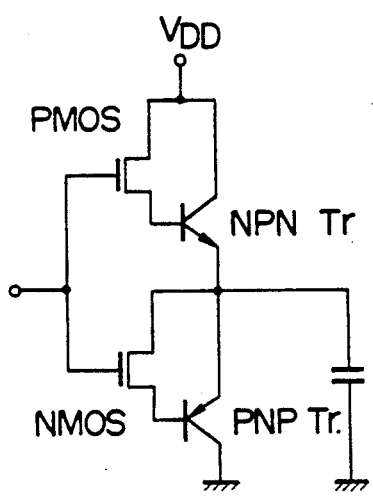

FIG. 2A is a plan view showing a conventional semiconductor device including a PMOS transistor and npn bipolar transistor, and FIG. 2B is a plan view showing a semiconductor device manufactured in the steps in FIGS. 1A to 1H according to the present invention. Referring to FIGS. 2A and 2B, reference symbol G denotes a gate electrode of the PMOS transistor; D, a drain of the PMOS transistor; B, a base electrode of the npn bipolar transistor; and E, an emitter electrode of the npn bipolar transistor. As shown in FIG. 2A, in a conventional semiconductor device, a distance of a (μm) (for example, 7.5 μm) from the center of a gate electrode to the boundary of an active region is required for manufacture. In a semiconductor device according to the present invention, since a drain electrode and a base electrode can be made of the same material to have a single layer, this margin is not required. As shown in FIG. 2B, the distance a can be reduced to a'=5 μm, thereby reducing the element density to about 67%. Therefore, the present invention is effectively employed in a circuit having an arrangement in which the drain electrode of the PMOS transistor and the base region of the bipolar transistor are connected to each other, as shown in FIG. 2C. In addition, according to the device of the present invention, a drain capacitance $C_{drain}$ between the PMOS transistor and its diffusion layer, and a capacitance $C_{cd}$ between a base and a collector, are reduced to 40% compared with a conventional device. Therefore, the circuit speed can be increased by 10% compared with a conventional device. In addition, as shown in FIG. 1H, since the oxide film remains after formation of elements to constitute an offset structure, the IC yield can be increased by 20%.

In addition, as shown in FIG. 3, according to the present invention a p+-type polysilicon layer is used instead of an n+-type polysilicon layer. Therefore, a PMOS transistor having a gate length $L_{gate}$ of 0.5 μm can be formed when the threshold voltage Vth is −0.5 V.

As is apparent from the above-described embodiment, the present invention includes the following features.

The same kind of polysilicon is used in forming electrodes (including the gate electrode and source drain electrodes) of a MOS transistor and the base electrode of a bipolar transistor. A single annealing process is applied to the MOS transistor, and the annealing process is applied to the bipolar transistor twice.

The base electrode and the opening for the emitter electrode have a self-aligned structure.

The gate electrode, the emitter electrode and the base electrode include a multilayered- structure made of a silicide or metal and polysilicon.

At least one element selected from Mo, W, Ti, Ta, and Co is used in the silicide or as the metal.

The external base region of the bipolar transistor has an intermediate concentration value between the concentrations of the external base electrode and an internal base region.

The source drain extraction electrode and the gate electrode of the MOS transistor are made of the same layer.

An n+-type or p+-type region of low resistance, serving as the source or the drain region, is formed by diffusing an impurity from a third polysilicon layer, as in the emitter.

The concentration of the n-well region of an npn bipolar transistor is substantially equal to that of the n-well region of a PMOS transistor.

The concentration of the p-well region of a pnp bipolar transistor is substantially equal to that of the n-well region of an NMOS transistor.

The thickness of the first polysilicon layer is 500 Å or less.

The thickness of the second polysilicon layer is 1,000 Å or less.

The first polysilicon layer is formed at a temperature of 610° C. or more, and the second polysilicon layer is formed at a temperature of 600° C. or less.

During formation of the second polysilicon layer, an $H_2$ gas can be used as a carrier gas for $SiH_4$.

During the step of forming the third polysilicon layer, in which the emitter is to be formed, an $H_2$ gas can be used as a carrier gas for $SiH_4$ and the third polysilicon layer, formed at the same time as a high-resistance element, a thin-film transistor element or a low-resistance wiring material, is deposited at a temperature of 600° C. or less.

The emitter electrode of the bipolar transistor an the source drain electrode of the MOS transistor are made of the third polysilicon layer.

A high-concentration $p^+$-type buried region is formed under the pnp transistor, and a low-concentration p-type region is present between this buried region and an $n^+$-type buried region.

According to the above-described embodiment, the external base contact resistance, which is about 1 k$\Omega$ in a conventional device, can be reduced to 20 $\Omega$, and the emitter resistance, which was about 1 k$\Omega$ in the conventional device, can be reduced to 20 $\Omega$. The maximum threshold value $f_{Tmax}$, of 10 GHz in a conventional npn bipolar transistor, can be increased to 15 GHz or more. In addition, the area of the pattern region of the npn transistor can be reduced to 1/10 or less of the conventional device, and the number of steps required for forming the bipolar transistors having the same characteristics can also be reduced to 1/10 or less. Further, a maximum voltage of 3.5 V or less is applied to at least one MOS transistor during operation.

As has been described above, according to the present invention, there is provided a high-performance semiconductor device capable of preventing the short channel effect and an increase in base resistance such that the electrodes of the MOS transistor and the base electrode of the bipolar transistor are made of the same kind of material, and an annealing process is performed once for the MOS transistor and twice for the bipolar transistor.

According to the present invention, there is provided a method of manufacturing a high-performance semiconductor device capable of preventing the short channel effect and an increase in base resistance such that the electrodes of the MOS transistor and the base electrode of the bipolar transistor are made of the same kind of material, and an annealing process is performed once for the MOS transistor and twice for the bipolar transistor.

Additional advantages and modifications will readily occur to those skilled in the art. Therefore, the invention in its broader aspects is not limited to the specific details, representative devices, and illustrated examples shown and described herein. Accordinqly, various modifications may be made without departing from the spirit or scope of the general inventive concept as defined by the appended claims and their equivalents.

What is claimed is:

1. A method of fabricating a semiconductor device including a bipolar transistor and a MOS transistor, the method comprising the steps of:
    preparing a semiconductor substrate;
    forming a gate oxide film on a surface of said semiconductor substrate;
    selectively removing said gate oxide film to expose portions of said semiconductor substrate;
    forming a first polysilicon layer on a resultant semiconductor structure;
    implanting impurities in said first polysilicon layer;
    annealing a resultant semiconductor structure to activate the impurities;
    patterning said first polysilicon layer to form a base electrode of said bipolar transistor and a drain electrode of said MOS transistor;
    forming an insulating layer on a resultant semiconductor structure;
    selectively exposing portions of said semiconductor substrate;
    forming a second polysilicon layer on a resultant semiconductor structure; and
    patterning said second polysilicon layer to form an emitter electrode of said bipolar transistor.

2. The method according to claim 1 wherein said gate oxide film is formed to a thickness less than approximately 120 angstroms.

3. The method according to claim 1 wherein said second polysilicon layer is formed at a temperature less than approximately 600° C.

4. The method according to claim 1 wherein said first polysilicon layer is formed at a temperature less than approximately 600° C.

5. A method of fabricating a semiconductor device including a bipolar transistor and a MOS transistor, the method comprising the steps of:
    preparing a semiconductor substrate;
    forming a gate oxide film on a surface of said semiconductor substrate;
    forming a first polysilicon layer on said gate oxide film;
    selectively removing said first polysilicon layer and gate oxide film to expose portions of said semiconductor substrate;
    forming a second polysilicon layer on a resultant semiconductor structure;
    implanting impurities in said second polysilicon layer;
    annealing a resultant semiconductor structure to activate the impurities;
    patterning said first and second polysilicon layers to form a base electrode of said bipolar transistor and a gate electrode of said MOS transistor;
    forming an insulating layer on a resultant semiconductor structure;
    selectively exposing portions of said semiconductor substrate;
    forming a third polysilicon layer on a resultant semiconductor structure; and
    patterning said third polysilicon layer to form an emitter electrode of said bipolar transistor.

6. The method according to claim 5 wherein said gate oxide film is formed to a thickness less than approximately 120 angstroms.

7. The method according to claim 5 wherein said first polysilicon layer is formed at a temperature greater than approximately 610° C.

8. The method according to claim 5 wherein said second polysilicon layer is formed at a temperature less than approximately 600° C.

9. The method according to claim 5 wherein said third polysilicon layer is formed at a temperature less than approximately 600° C.

10. A method of fabricating a semiconductor device including a bipolar transistor and a MOS transistor, the method comprising the steps of:

preparing a semiconductor substrate;

forming a gate oxide film on a surface of said semiconductor substrate;

forming a first polysilicon layer on said gate oxide film;

selectively removing said first polysilicon layer and gate oxide film to expose portions of said semiconductor substrate;

forming a second polysilicon layer on a resultant semiconductor structure;

implanting impurities in said second polysilicon layer;

annealing a resultant semiconductor structure to activate the impurities;

patterning said first and second polysilicon layers to form a base electrode of said bipolar transistor and a gate electrode of said MOS transistor;

forming an insulating layer on a resultant semiconductor structure;

selectively exposing portions of said semiconductor substrate;

forming a third polysilicon layer on a resultant semiconductor structure; and patterning said third polysilicon layer to form an emitter electrode of said bipolar transistor.

11. The method according to claim 10 wherein said gate oxide film is formed to a thickness less than approximately 120 angstroms.

12. The method according to claim 10 wherein said first polysilicon layer is formed at a temperature greater than approximately 610° C.

13. The method according to claim 10 wherein said second polysilicon layer is formed at a temperature less than approximately 600° C.

14. The method according to claim 10 wherein said third polysilicon layer is formed at a temperature less than approximately 600° C.

15. A method of fabricating an electrode structure for a semiconductor device including a bipolar transistor and a MOS transistor having semiconductor regions formed in a semiconductor substrate, the method comprising the steps of:

forming a first polysilicon layer in contact with a base region of said bipolar transistor and spaced from a channel region of said MOS transistor by an insulating film;

patterning a base electrode of said bipolar transistor and a drain electrode of said MOS transistor from said first polysilicon layer;

forming a second polysilicon layer in contact with an emitter region of said bipolar transistor; and patterning an emitter electrode of said bipolar transistor from said second polysilicon layer.

* * * * *